US012028098B2

(12) United States Patent
Lin

(10) Patent No.: US 12,028,098 B2
(45) Date of Patent: *Jul. 2, 2024

(54) RADIO-FREQUENCY POWER AMPLIFIER WITH AMPLITUDE MODULATION TO PHASE MODULATION (AMPM) COMPENSATION

(71) Applicant: Apple Inc., Cupertino, CA (US)

(72) Inventor: Saihua Lin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/687,829

(22) Filed: Mar. 7, 2022

(65) Prior Publication Data

US 2023/0079254 A1 Mar. 16, 2023

Related U.S. Application Data

(60) Provisional application No. 63/243,627, filed on Sep. 13, 2021.

(51) Int. Cl.
*H04B 1/04* (2006.01)
*H03F 3/24* (2006.01)

(52) U.S. Cl.
CPC ............ *H04B 1/0475* (2013.01); *H03F 3/245* (2013.01); *H03F 2200/451* (2013.01); *H04B 2001/045* (2013.01)

(58) Field of Classification Search
CPC . H04B 1/0475; H04B 2001/045; H03F 3/245; H03F 2200/451

(Continued)

(56) References Cited

U.S. PATENT DOCUMENTS 7,301,396 B1 * 11/2007 Johnson .............. H03F 3/45183
330/151
9,866,181 B2    1/2018 Zhang et al.
(Continued)

FOREIGN PATENT DOCUMENTS

CN        112886932 A      6/2021
KR        101890579 B1     9/2018
(Continued)

OTHER PUBLICATIONS

Tianzuo Xi et al., Low-Phase-Noise 54-GHz Transformer-Coupled Quadrature VCO and 76-/90-GHz VCOs in 65-nm CMOS, IEEE Transactions on Microwave Theory and Techniques, Jul. 2016, pp. 2091-2103, vol. 64, No. 7, IEEE, USA.

(Continued)

*Primary Examiner* — Kevin M Burd
(74) *Attorney, Agent, or Firm* — Treyz Law Group; Jason Tsai

(57) ABSTRACT

An electronic device may include wireless circuitry with a processor, a transceiver, an antenna, and a front-end module coupled between the transceiver and the antenna. The front-end module may include one or more power amplifiers for amplifying a signal for transmission through the antenna. A power amplifier may include a phase distortion compensation circuit. The phase distortion compensation circuit may include one or more n-type metal-oxide-semiconductor capacitors configured to receive a bias voltage. The bias voltage may be set to provide the proper amount of phase distortion compensation.

20 Claims, 9 Drawing Sheets

(58) Field of Classification Search
USPC .......................................................... 375/297
See application file for complete search history.

(56) References Cited

U.S. PATENT DOCUMENTS

| | | | |
|---|---|---|---|
| 10,965,261 | B2 | 3/2021 | Dunworth et al. |
| 11,313,896 | B1* | 4/2022 | Roessler ............. H03K 17/6871 |
| 11,601,152 | B1* | 3/2023 | Lin ....................... H04B 1/0458 |
| 2009/0039964 | A1* | 2/2009 | Hijikata .................... H03F 1/42 |
| | | | 330/277 |
| 2012/0176710 | A1* | 7/2012 | Domanski .............. H02H 9/046 |
| | | | 257/300 |
| 2017/0207758 | A1* | 7/2017 | Tseng ........................ H03F 1/14 |
| 2018/0080957 | A1* | 3/2018 | Sander .................. G01R 15/146 |
| 2022/0247358 | A1* | 8/2022 | Salameh ............. H03F 3/45183 |
| 2022/0416730 | A1* | 12/2022 | Su ......................... H03F 1/0222 |

FOREIGN PATENT DOCUMENTS

| | | | | |
|---|---|---|---|---|
| WO | 2016130295 | A1 | 8/2016 | |
| WO | WO-2016130295 | A1 * | 8/2016 | ............. H03F 1/223 |

OTHER PUBLICATIONS

Thomas Tille et al., A Low-voltage MOSFET-only /spl Sigma Delta/ Modulator For Speech Band Applications Using Depletion-mode MOS-capacitors In Combined Series And Parallel Compensation, The 2001 IEEE International Symposium on Circuits and Systems, May 2001, pp. 376-379 vol. 1, IEEE, USA.

\* cited by examiner

RADIO-FREQUENCY POWER AMPLIFIER WITH AMPLITUDE MODULATION TO PHASE MODULATION (AMPM) COMPENSATION

This application claims the benefit of provisional patent application No. 63/243,627, filed Sep. 13, 2021, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to transmit and receive radio-frequency signals.

Radio-frequency signals transmitted by an antenna are often fed through one or more power amplifiers, which are configured to amplify low power analog signals to higher power signals more suitable for transmission through the air over long distances. It can be challenging to design a satisfactory power amplifier for an electronic device.

SUMMARY

An electronic device may include wireless communications circuitry. The wireless communications circuitry may include one or more processor for generating digital (baseband) signals, a transceiver for receiving the digital (baseband) signals and for generating corresponding radio-frequency signals, and one or more power amplifiers configured to amplify the radio-frequency signals for transmission by one or more antenna in the electronic device. The power amplifier may include an amplitude modulation to phase modulation (AMPM) distortion compensation circuit. The AMPM distortion compensation circuit may be coupled to the input terminals of the power amplifier or to the output terminals of the power amplifier. The compensation circuit may include one or more n-type metal-oxide-semiconductor capacitors (MOSCAPs). The n-type MOSCAPs may be configured to receive a bias voltage at their gate terminals or may be configured to receive a bias voltage at their body terminals.

An aspect of the disclosure provides a radio-frequency power amplifier that includes an input transistor having a gate terminal configured to receive a radio-frequency input signal, a source terminal coupled to a ground power supply line, and a drain terminal coupled to a power amplifier output terminal; an inductor having a first terminal coupled to the power amplifier output terminal and a second terminal coupled to a positive power supply line; and an n-type metal-oxide-semiconductor capacitor coupled to the power amplifier output terminal. The radio-frequency power amplifier can further include an additional input transistor having a gate terminal configured to receive the radio-frequency input signal, a source terminal coupled to the ground power supply line, and a drain terminal coupled to an additional power amplifier output terminal; an additional inductor having a first terminal coupled to the additional power amplifier output terminal and a second terminal coupled to the positive power supply line; and an additional n-type metal-oxide-semiconductor capacitor coupled to the additional power amplifier output terminal. First and second cascode transistors can be coupled between the input transistors and the power amplifier output terminals. First and second capacitance neutralization transistors can be cross-coupled with the input transistors.

In one embodiment, the n-type metal-oxide-semiconductor capacitor can have a body terminal coupled to the ground power supply line and a gate terminal coupled to the power amplifier output terminal, whereas the additional n-type metal-oxide-semiconductor capacitor can have a body terminal coupled to the ground power supply line and a gate terminal coupled to the additional power amplifier output terminal. The power amplifier can further include a first capacitor coupled between the gate terminal of the n-type metal-oxide-semiconductor capacitor and the power amplifier output terminal, a first resistor having a first terminal coupled to the gate terminal of the n-type metal-oxide-semiconductor capacitor and having a second terminal configured to receive a bias voltage, a second capacitor coupled between the gate terminal of the additional n-type metal-oxide-semiconductor capacitor and the additional power amplifier output terminal, and a second resistor having a first terminal coupled to the gate terminal of the additional n-type metal-oxide-semiconductor capacitor and having a second terminal configured to receive the bias voltage.

In another embodiment, the n-type metal-oxide-semiconductor capacitor can have a body terminal coupled to the ground power supply line and a gate terminal directly coupled to the power amplifier output terminal, whereas the additional n-type metal-oxide-semiconductor capacitor can have a body terminal coupled to the ground power supply line and a gate terminal directly coupled to the additional power amplifier output terminal. The power amplifier can further include a capacitor having a first terminal coupled to the body terminals of the n-type metal-oxide-semiconductor capacitor and the additional n-type metal-oxide-semiconductor capacitor and having a second terminal coupled to the ground power supply line. The body terminals of the n-type metal-oxide-semiconductor capacitor and the additional n-type metal-oxide-semiconductor capacitor can be configured to receive a bias voltage.

An aspect of the disclosure provides a radio-frequency power amplifier that includes an input transistor having a gate terminal configured to receive a radio-frequency input signal via a power amplifier input terminal, a source terminal coupled to a ground power supply line, and a drain terminal coupled to a power amplifier output terminal; an inductor having a first terminal coupled to a power amplifier output terminal and a second terminal coupled to a positive power supply line; and an n-type metal-oxide-semiconductor capacitor coupled to the power amplifier input terminal. The radio-frequency power amplifier can further include an additional input transistor having a gate terminal configured to receive the radio-frequency input signal via an additional power amplifier input terminal, a source terminal coupled to the ground power supply line, and a drain terminal coupled to an additional power amplifier output terminal; an additional inductor having a first terminal coupled to the additional power amplifier output terminal and a second terminal coupled to the positive power supply line; and an additional n-type metal-oxide-semiconductor capacitor coupled to the additional power amplifier input terminal. The n-type metal-oxide-semiconductor capacitor can have a body terminal coupled to the ground power supply line and a gate terminal coupled to the power amplifier input terminal. The additional n-type metal-oxide-semiconductor capacitor can have a body terminal coupled to the ground power supply line and a gate terminal coupled to the additional power amplifier input terminal. The power amplifier can further include a first capacitor coupled between the gate terminal of the n-type metal-oxide-semiconductor capacitor and the power amplifier input terminal; a first resistor having a first terminal coupled to the gate terminal of the n-type metal-oxide-semiconductor capacitor and having a second terminal configured to receive a bias voltage; a second capacitor coupled between the gate terminal of the additional n-type metal-oxide-semiconductor capacitor and the additional power amplifier input terminal; and a second resistor having a first terminal coupled to the gate terminal of the additional n-type metal-oxide-semiconductor capacitor and having a second terminal configured to receive the bias voltage.

An aspect of the disclosure provides an electronic device that includes a processor configured to generate baseband signals, a transceiver configured to generate radio-frequency signals based on the baseband signals, and power amplifier circuitry configured to amplify the radio-frequency signals for wireless transmission by an antenna. The power amplifier circuitry can include a first input transistor having a first source-drain terminal coupled to a ground line, a second source-drain terminal coupled to a first output terminal, and a gate terminal configured to receive the radio-frequency signals from the transceiver, a second input transistor having a first source-drain terminal coupled to the ground line, a second source-drain terminal coupled to a second output terminal, and a gate terminal configured to receive the radio-frequency signals from the transceiver, a first inductor coupled between the first output terminal and a positive power supply line, a second inductor coupled between the second output terminal and the positive power supply line, and an amplitude modulation to phase modulation (AMPM) compensation circuit coupled to the first and second output terminals, the AMPM compensation circuit having at least one n-type metal-oxide-semiconductor capacitor.

In one embodiment, the AMPM compensation circuit can include a first n-type metal-oxide-semiconductor capacitor having a gate terminal and a body terminal that is coupled to the ground line; a first capacitor coupled between the first output terminal and the gate terminal of the first n-type metal-oxide-semiconductor capacitor; a first resistor having a first terminal coupled to the gate terminal of the first n-type metal-oxide-semiconductor capacitor and having a second terminal configured to receive a bias voltage; a second n-type metal-oxide-semiconductor capacitor having a gate terminal and a body terminal that is coupled to the ground line; a second capacitor coupled between the second output terminal and the gate terminal of the second n-type metal-oxide-semiconductor capacitor; and a second resistor having a first terminal coupled to the gate terminal of the second n-type metal-oxide-semiconductor capacitor and having a second terminal configured to receive the bias voltage.

In another embodiment, the AMPM compensation circuit can include a first n-type metal-oxide-semiconductor capacitor having a body terminal and a gate terminal that is directly coupled to the first output terminal; a second n-type metal-oxide-semiconductor capacitor having a body terminal and a gate terminal that is directly coupled to the second output terminal; and a shunt capacitor having a first terminal coupled to the body terminals of the first and second n-type metal-oxide-semiconductor capacitors and having a second terminal coupled to the ground line. The body terminals of the first and second n-type metal-oxide-semiconductor capacitors can be configured to receive a bias voltage.

DETAILED DESCRIPTION

An electronic device may be provided with wireless transmitter circuitry. The wireless transmitter circuitry may include a transmitter circuit for outputting a transmit signal, a radio-frequency power amplifier for amplifying the transmit signal, and an antenna for radiating the amplified signal. In practice, the power amplifier may exhibit an amplitude modulation to phase modulation (AMPM) distortion caused by the non-linear input capacitance of the power amplifier. To help mitigate or compensate such AMPM distortion, the power amplifier may include an AMPM compensation circuit coupled to the input or the output of the power amplifier. The AMPM compensation circuit may include one or more n-type metal-oxide-semiconductor capacitors configured to receive a bias voltage. The bias voltage may have a voltage level that is selected based on the type of AMPM distortion. Configuring and operating a radio-frequency power amplifier in this way reduces undesired AMPM distortion.

Figure 1:
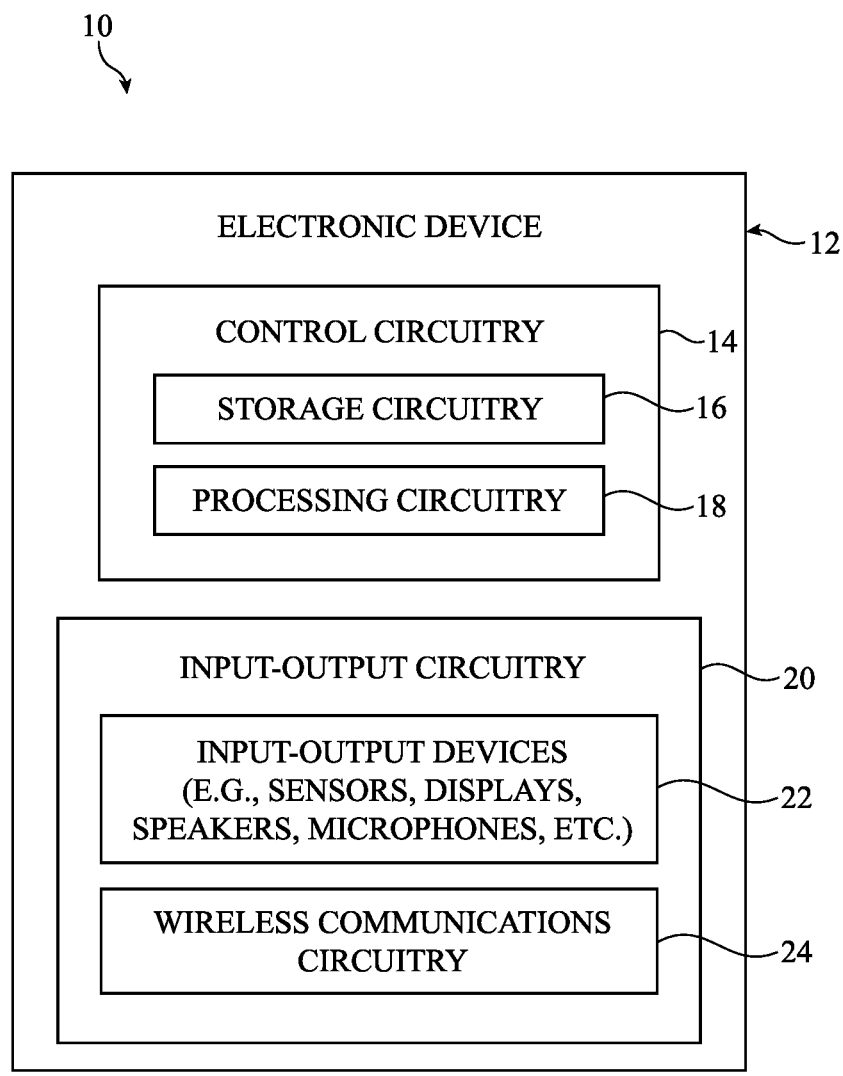
FIG. 1 is a diagram of an illustrative electronic device having wireless communications circuitry in accordance with some embodiments.

FIG. 1 is a diagram of an electronic device such as electronic device 10 that can be provided with such wireless transmitter circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application processors, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
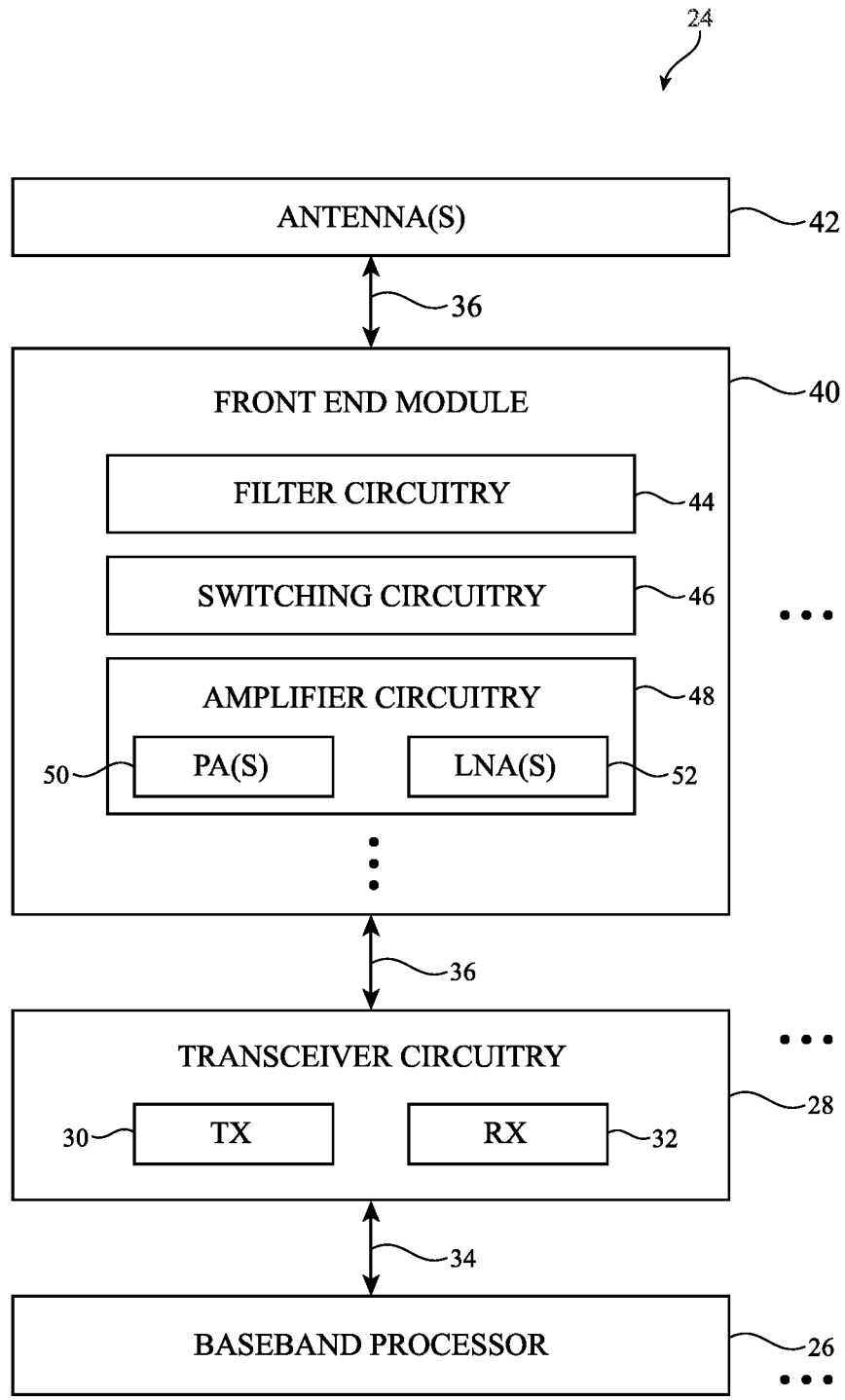
FIG. 2 is a diagram of illustrative wireless communications circuitry having amplifier circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 36, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry for up-converting (or modulating) the baseband signals to radio-frequencies prior to transmission over antenna 42. The example of FIG. 2 in which baseband processor 26 communicates with transceiver 28 is merely illustrative. In general, transceiver 28 may communicate with a baseband processor, an application processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to baseband processor 26 over baseband path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier circuitry, transmit amplifier circuitry, or amplifier circuitry) may be configured to amplify a radio-frequency signal without changing the signal shape, format, or modulation. Power amplifier 50 may, for example, be used to provide 10 dB of gain, 20 dB of gain, 10-20 dB of gain, less than 20 dB of gain, more than 20 dB of gain, or other suitable amounts of gain.

Figure 3:
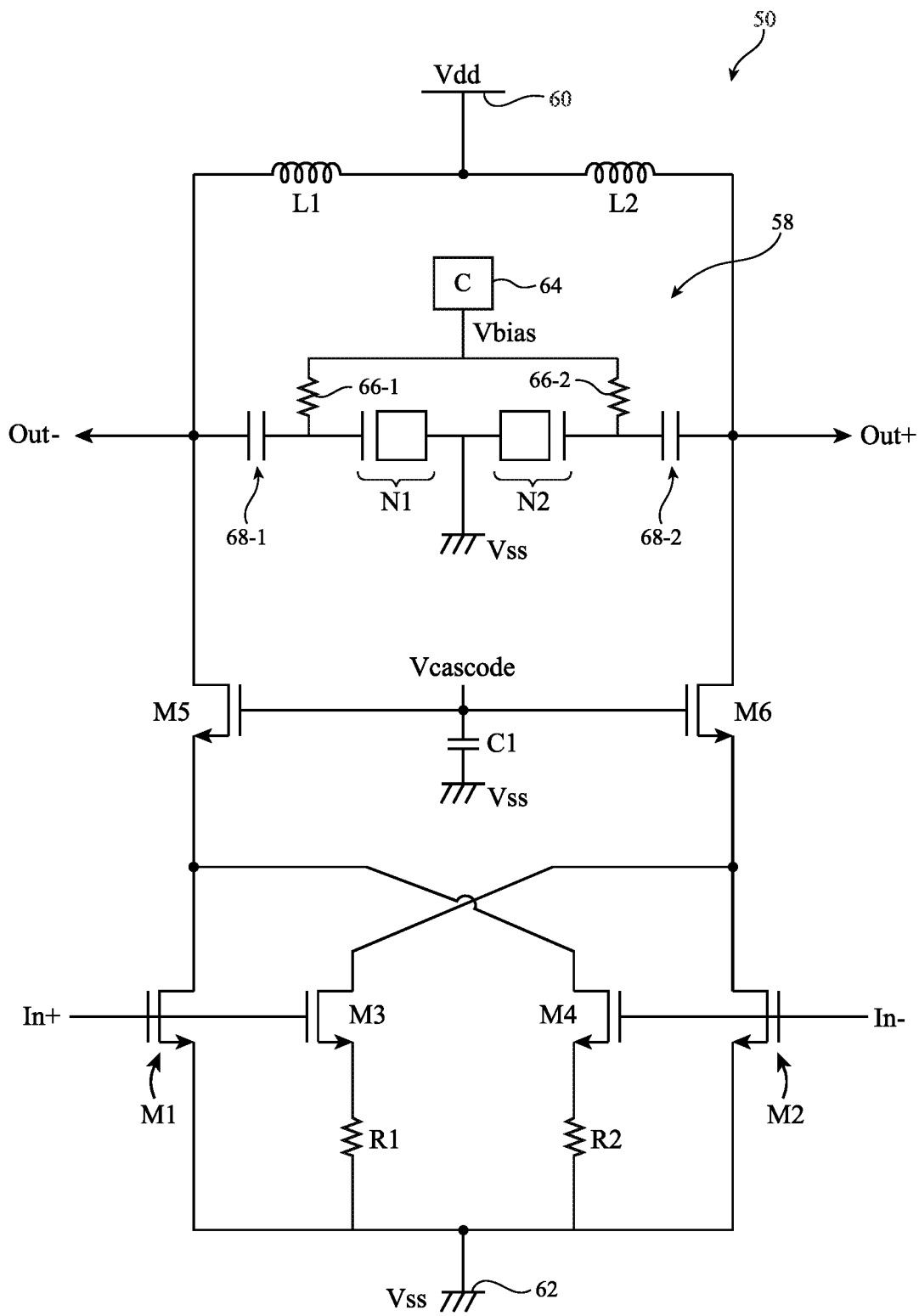
FIG. 3 is a diagram of an illustrative power amplifier having an amplitude modulation to phase modulation (AMPM) compensation circuit coupled at an output port in accordance with some embodiments.

FIG. 3 is a circuit diagram showing one implementation of power amplifier 50. As shown in FIG. 3, power amplifier 50 may include transistors M1, M2, M3, M4, M5, and M6, resistors R1 and R2, capacitor C1, and inductors L1 and L2. Transistors M1-M6 may be n-type (n-channel) transistors such as n-type metal-oxide-semiconductor (NMOS) devices. Transistor M1 may have a source terminal coupled to a ground power supply line 62 (e.g., a ground line on which ground power supply voltage Vss is provided), a drain terminal, and a gate terminal coupled to a positive input terminal In+. Transistor M2 may have a source terminal coupled to ground power supply line 62, a drain terminal, and a gate terminal coupled to a negative input terminal In−. Input terminals In+ and In− serve collectively as the differential input port of power amplifier 50, so transistors M1 and M2 are sometimes referred to as the input transistors. The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa).

Transistor M3 may have a source terminal coupled to ground power supply line 62 via resistor R1, a gate terminal coupled to positive input terminal In+, and a drain terminal cross-coupled to the drain terminal of input transistor M2. Transistor M4 may have a source terminal coupled to ground power supply line 62 via resistor R2, a gate terminal coupled to negative input terminal In−, and a drain terminal cross-coupled to the drain terminal of input transistor M1. Configured in this way, cross-coupled transistors M3 and M4 can be used to neutralize the gate-to-drain parasitic capacitance of input transistors M1 and M2 and are therefore sometimes referred to as parasitic capacitance neutralization transistors. The use of parasitic capacitance neutralization transistors M3 and M4 (and the corresponding resistors R1 and R2) are optional.

Transistor M5 may have a source terminal coupled to the drain terminal of input transistor M1, a gate terminal configured to receive a cascode voltage Vcascode, and a drain terminal coupled to a negative output terminal Out−. Transistor M6 may have a source terminal coupled to the drain terminal of input transistor M2, a gate terminal configured to receive cascode voltage Vcascode, and a drain terminal coupled to a positive output terminal Out+. Output terminals Out+ and Out−, sometimes referred to as power amplifier output terminals, serve collectively as the differential output port of power amplifier 50. A shunt capacitor C1 may be attached to the gate terminals of transistors M5 and M6. Voltage Vcascode may have some intermediate voltage level between ground voltage level Vss and a positive power supply voltage Vdd. If desired, voltage Vcascode may also be equal to positive power supply voltage Vdd.

Transistors M5 and M6 interposed between the drain terminals of the input transistors and the differential output port in this way are sometimes referred to collectively as cascode transistors. A cascode transistor (stage) can be defined as an amplifier stage with an amplifying transistor that has its gate terminal coupled to a common (fixed) voltage source (e.g., Vcascode). The cascode transistor stage with M5 and M6 may be used to increase the output impedance of power amplifier 50 and can optionally be used to provide different gain steps (e.g., by selectively adjusting the drive strength of transistors M5 and M6). The use of cascode transistors M5 and M6 are optional (e.g., the drain terminal of input transistor M1 can be directly connected to negative output terminal Out− without any intervening cascode transistor M5, and the drain terminal of input transistor M2 can be directly connected to positive output terminal Out+ without any intervening cascode transistor M6).

Inductor L1 may have a first terminal coupled to negative output terminal Out− and a second terminal coupled to positive power supply line 60 (e.g., a power supply terminal on which positive power supply voltage Vdd is provided). Inductor L2 may have a first terminal coupled to positive output terminal Out+ and a second terminal coupled to positive power supply line 60. Inductors L1 and L2 configured in this way are sometimes referred to as load inductors.

The performance of a radio-frequency power amplifier is sometimes quantified by a parameter known as error vector magnitude (EVM). Ideally, a signal transmitted by a power amplifier would have signal modulation constellation points at certain ideal locations on a complex plane. Due to design imperfections, distortion, spurious signals, and/or noise, however, the actual constellation points often deviate from the ideal locations. Error vector magnitude is a measure of how far the actual points deviate from the ideal locations.

Amplifiers, in general, have a linear operating range and a non-linear operating range. To avoid signal distortion, amplifiers are often operated in the linear range. When operated in the non-linear range, the ratio of input power to output power may not be constant. Thus, as the input signal amplitude increases, a disproportionate increase in the output signal amplitude may occur. This unwanted additional amplitude modulation due to the non-linear characteristics of the amplifier is sometimes referred to as amplitude modulation to amplitude modulation (AMAM) distortion.

Similar to the output signal amplitude, the output phase of an amplifier may change disproportionately as the input signal amplitude increases. This unwanted additional amount of phase modulation due to the non-linear characteristics of the amplifier is sometimes referred to as amplitude modulation to phase modulation (AMPM) distortion.

Figure 4:
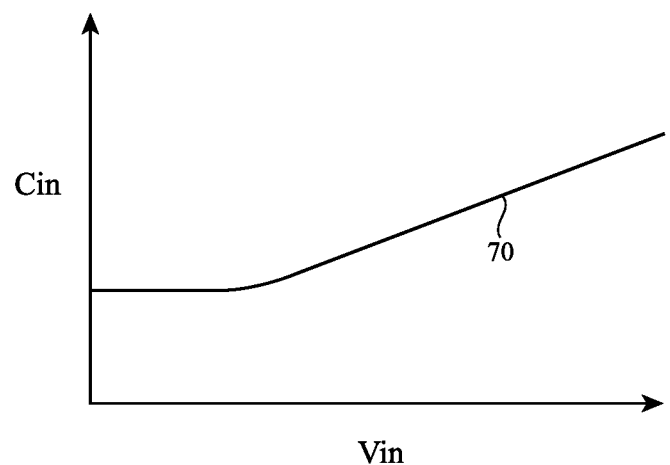
FIG. 4 is a diagram plotting input capacitance as a function of input voltage in accordance with some embodiments.
Figure 5:
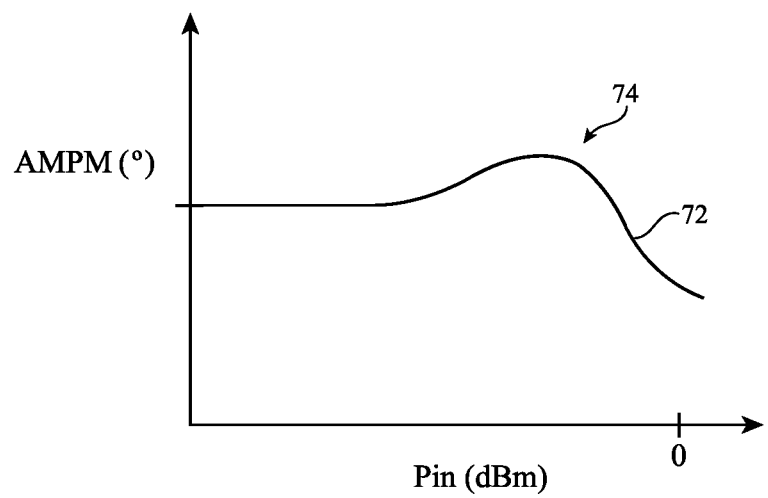
FIG. 5 is a diagram showing amplitude modulation to phase modulation (AMPM) peaking as a function of input power in accordance with some embodiments.

To improve EVM, it is generally desirable to reduce AMAM and AMPM distortion. One conventional way of compensating for AMAM and AMPM distortion is using digital predistortion. The use of digital predistortion, however, is not always possible. In millimeter wave wireless applications, however, analog predistortion operations may be more practical to help compensate for AMAM distortion. AMPM distortion, on the other hand, may be a function of the input capacitance of a power amplifier. FIG. 4 is a diagram plotting the input capacitance Cin of a power amplifier as a function of input voltage Vin. As shown by curve 70 in the plot of FIG. 4, the input capacitance Cin of the power amplifier may increase non-linearly as a function of Vin (e.g., Cin may increase as Vin increases). This non-linear capacitance may arise due to the parasitic gate-to-drain capacitance Cgd and parasitic gate-to-source capacitance Cgs of the input transistors (see, e.g., transistors M1 and M2 in FIG. 3). Such increasing Cin behavior of a power amplifier can lead to AMPM peaking as shown in FIG. 5. FIG. 5 plots the AMPM as a function of input power Pin without any AMPM compensation applied (i.e., with compensation circuit 58 disabled). In general, a higher amount of capacitance will result in more delay, which increases the amount of phase modulation and can lead to AMPM peaking. As shown by curve 72 in FIG. 5, the AMPM may exhibit an unwanted peaking 74 due to the increasing Cin.

To help compensate this unwanted AMPM peaking 74, power amplifier 50 may be provided with a phase compensation circuit such as AMPM compensation circuit 58 (see, e.g., FIG. 3). Compensation circuit 58 is sometimes referred to as an AMPM distortion compensation circuit. Compensation circuit 58 may include n-type metal-oxide-semiconductor capacitors (MOSCAPs) such as n-type (n-channel) metal-oxide-semiconductor capacitors N1 and N2, capacitors 68-1 and 68-2, and resistors 66-1 and 66-2. As shown in FIG. 3, metal-oxide-semiconductor capacitor N1 may have a first (body) terminal coupled to the ground power supply line and a second (gate) terminal coupled to the negative output terminal Out− via coupling capacitor 68-1. Similarly, metal-oxide-semiconductor capacitor N2 may have a first (body) terminal coupled to the ground power supply line and a second (gate) terminal coupled to the positive output terminal Out+ via coupling capacitor 68-2.

The gate terminal of metal-oxide-semiconductor capacitor N1 may be configured to receive a bias voltage Vbias via a first biasing resistor 66-1. The gate terminal of metal-oxide-semiconductor capacitor N2 may be configured to receive bias voltage Vbias via a second biasing resistor 66-2. A power amplifier control circuit such as controller 64 may provide bias voltage Vbias to the gate terminals of MOSCAPs N1 and N2. The Vbias control circuit 64 may be a controller within front-end module 40 (see FIG. 2), a controller within transceiver circuitry 28, a controller within baseband processor 26, or a controller within control circuitry 14 (see FIG. 1). Bias voltage Vbias may be a fixed voltage level or an adjustable voltage that can be dynamically adjusted by control circuit 64 in real time.

Figure 6:
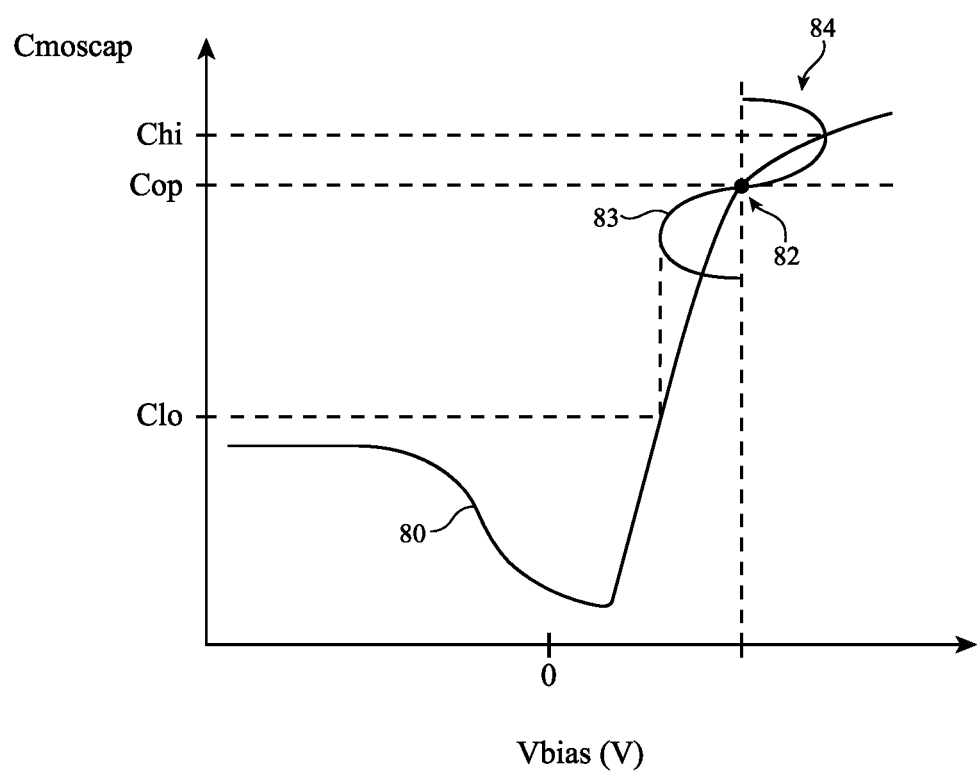
FIG. 6 is a diagram showing how an n-type metal-oxide-semiconductor capacitor can provide a reduced average capacitance when operated at a first bias point in accordance with some embodiments.

The amount of AMPM compensation provided by circuit 58 may be controlled by adjusting bias voltage Vbias, which sets the operating point for the metal-oxide-semiconductor capacitors N1 and N2. FIG. 6 is a diagram showing how an n-type metal-oxide-semiconductor capacitor can provide a reduced average capacitance when operated at a first bias point close to the turn-on region. As shown in FIG. 6, curve 80 represents the capacitance of an n-type MOSCAP as a function of Vbias at its gate, assuming its body terminal is shorted to ground. In one embodiment, the n-type MOSCAP may be operated at bias point 82 by setting voltage Vbias in a linear region 84 where the MOSCAP is close to the turn on state. When operated at bias point 82, any voltage swing around point 82 will cause the capacitance of the MOSCAP to vary along the characteristic curve 80. In as shown by voltage swing 83 in the example of FIG. 6, a positive input voltage swing may cause the capacitance to increase from Cop to Chi while a negative input voltage swing may cause the capacitance to decrease from Cop to Clo. At bias point 82, the drop from capacitance level Cop to Clo is substantially larger than the rise from Cop to Chi. In other words, as the input voltage swing increases, the average capacitance of the MOSCAP will also decrease.

Figure 7:
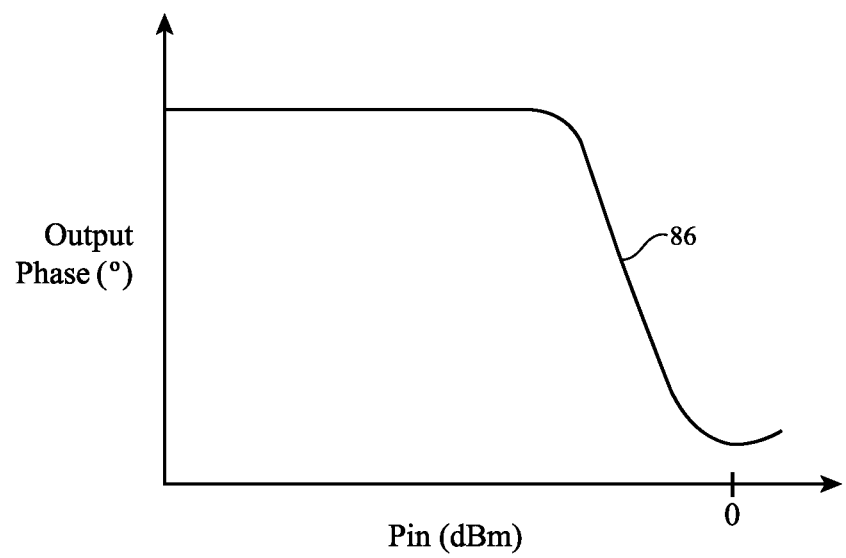
FIG. 7 is a diagram plotting a compensated output phase as a function of input power in accordance with some embodiments.

Such effect of providing a decreasing average capacitance can help offset the increasing input capacitance of the input transistors shown in FIG. 4. Thus, use of compensation circuit 58 with a proper bias point can help compensate any undesired AMPM peaking. In other words, Vbias may be set in the linear region close to the turn on point of the n-type MOSCAPs N1 and N2 to help compensate any unwanted AMPM caused by the input transistors. FIG. 7 is a diagram plotting a compensated output phase as a function of input power Pin (e.g., with compensation circuit 58 activated). As shown by curve 86 in FIG. 7, the resulting output phase may be relatively flat with no unwanted peaking until the roll-off point. Such a flat phase response curve may be indicative of a reduced AMPM distortion and thus an improved AMPM response.

The example above in which compensation circuit 58 is described as being biased at a relatively high bias point to help compensate for AMPM peaking is merely illustrative. In other scenarios, it is also possible that power amplifier 50 initially suffer from undesired AMPM drooping. An AMPM droop may, for example, be caused by decreasing input capacitance as the input voltage increases. As described above, the amount of AMPM compensation provided by circuit 58 may be controlled by adjusting bias voltage Vbias, which sets the operating point for the metal-oxide-semiconductor capacitors N1 and N2.

Figure 8:
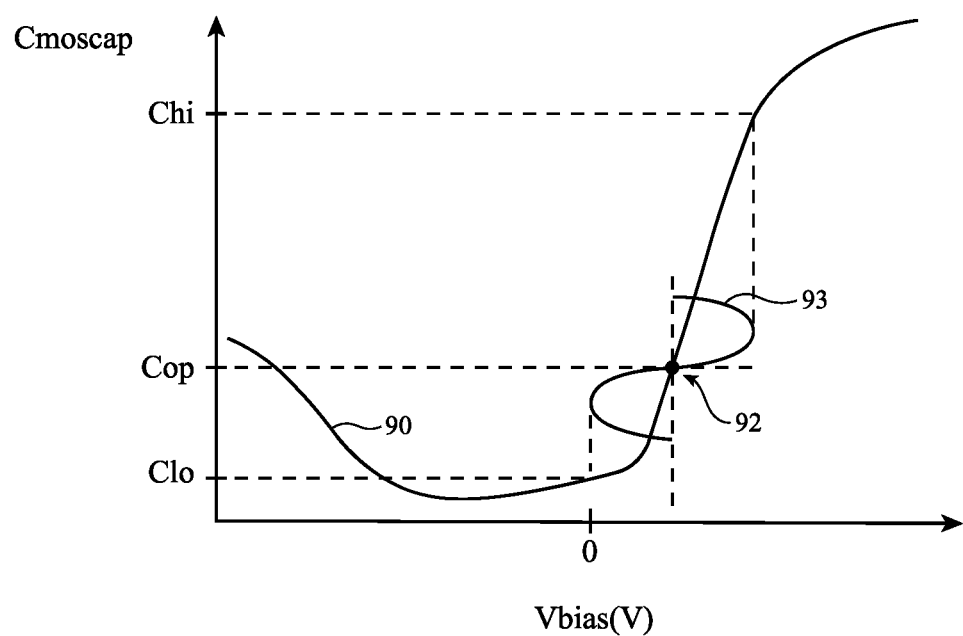
FIG. 8 is a diagram showing how an n-type metal-oxide-semiconductor capacitor can provide an increased average capacitance when operated at a second bias point in accordance with some embodiments.

FIG. 8 is a diagram showing how an n-type metal-oxide-semiconductor capacitor can provide an increased average capacitance when operated at a second bias point closer to 0 V. As shown in FIG. 8, curve 90 represents the capacitance of an n-type MOSCAP as a function of Vbias at its gate, assuming its body terminal is shorted to ground. In the example of FIG. 8, the n-type MOSCAP may be operated at bias point 92 by setting voltage Vbias in a region away from the turn on state. When operated at bias point 92, any voltage swing around point 92 will cause the capacitance of the MOSCAP to vary along the characteristic curve 90. In as shown by voltage swing 93 in the example of FIG. 8, a positive input voltage swing may cause the capacitance to increase from Cop to Chi while a negative input voltage swing may cause the capacitance to decrease from Cop to Clo. At bias point 92, the rise from capacitance level Cop to Chi is substantially larger than the drop from Cop to Clo. In other words, as the input voltage swing increases, the average capacitance of the MOSCAP will also increase.

Such effect of providing an increasing average capacitance can help offset a decreasing input capacitance of the input transistors that might be causing an AMPM droop. Thus, use of compensation circuit 58 with a proper bias point can help compensate any undesired AMPM drooping. In other words, voltage Vbias may be set in a region close to 0 V for the n-type MOSCAPs N1 and N2 to help compensate any unwanted AMPM droop caused by the input transistors. This can again result in a relatively flat output phase response as shown in FIG. 7, which is indicative of a reduced AMPM distortion and thus an improved AMPM response.

Figure 9:
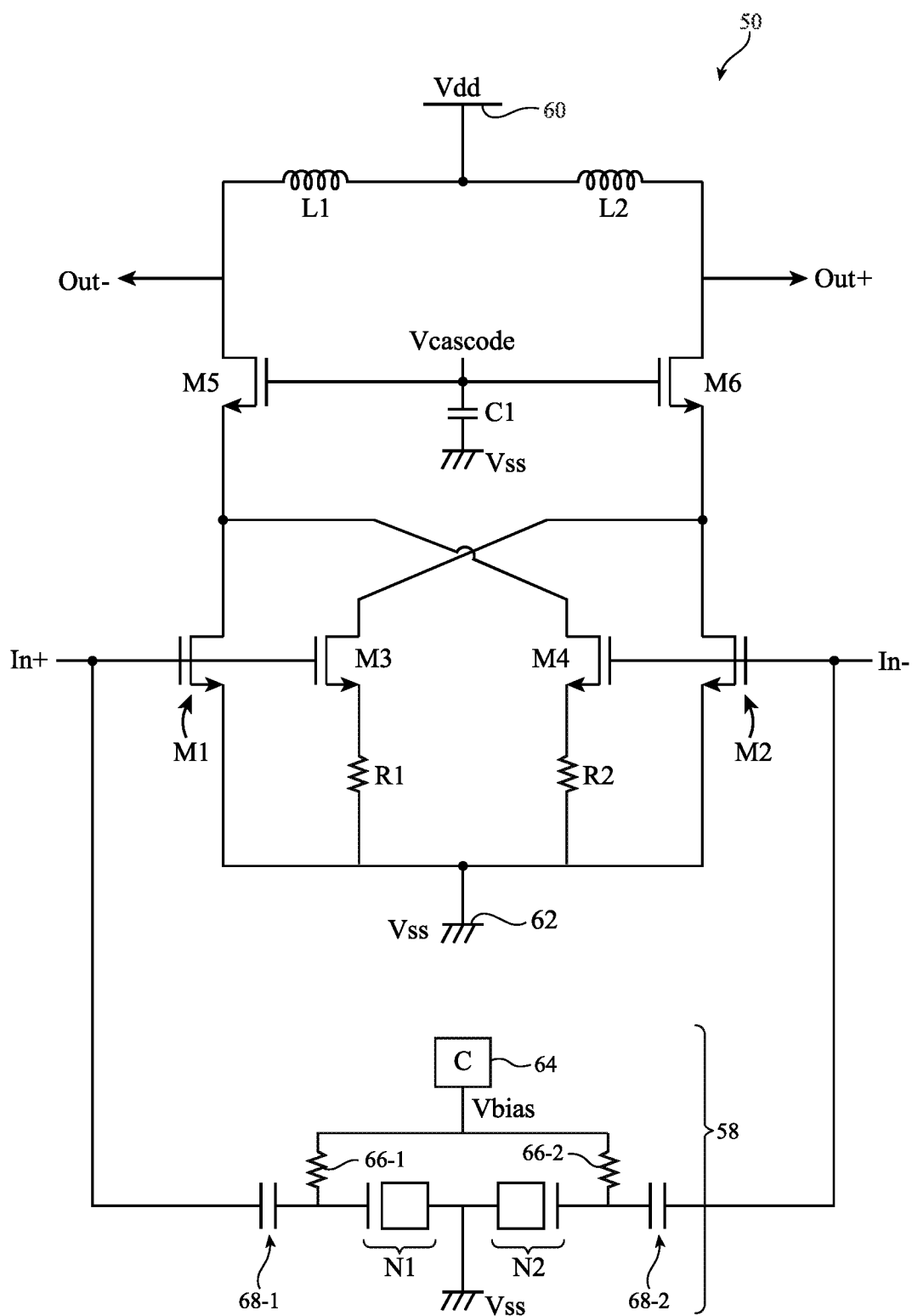
FIG. 9 is a diagram of an illustrative power amplifier having an amplitude modulation to phase modulation (AMPM) compensation circuit coupled at an input port in accordance with some embodiments.

The example of FIG. 3 in which AMPM compensation circuit 58 is coupled to the output port of power amplifier 50 is merely illustrative. FIG. 9 illustrates another embodiment of power amplifier 50 having compensation circuit 58 coupled to the input port. As shown in FIG. 9, compensation circuit 58 may include n-type metal-oxide-semiconductor capacitors (MOSCAPs) such as n-type (n-channel) metal-oxide-semiconductor capacitors N1 and N2, capacitors 68-1 and 68-2, and resistors 66-1 and 66-2. As shown in FIG. 9, metal-oxide-semiconductor capacitor N1 may have a first (body) terminal coupled to the ground power supply line and a second (gate) terminal coupled to the positive input terminal In+ via coupling capacitor 68-1. Similarly, metal-oxide-semiconductor capacitor N2 may have a first (body) terminal coupled to the ground power supply line and a second (gate) terminal coupled to the negative input terminal In− via coupling capacitor 68-2.

The gate terminal of metal-oxide-semiconductor capacitor N1 may be configured to receive a bias voltage Vbias via a first biasing resistor 66-1. The gate terminal of metal-oxide-semiconductor capacitor N2 may be configured to receive bias voltage Vbias via a second biasing resistor 66-2. A power amplifier control circuit such as controller 64 may provide bias voltage Vbias to the gate terminals of MOSCAPs N1 and N2. The Vbias control circuit 64 may be a controller within front-end module 40 (see FIG. 2), a controller within transceiver circuitry 28, a controller within baseband processor 26, or a controller within control circuitry 14 (see FIG. 1). The amount and polarity of AMPM compensation provided by circuit 58 may be controlled by adjusting bias voltage Vbias, which sets the operating point for the metal-oxide-semiconductor capacitors N1 and N2. For instance, bias voltage Vbias can be adjusted to a first voltage level to compensate for any AMPM peaking or can be adjusted to a second voltage level to compensate for any AMPM droop.

Figure 10:
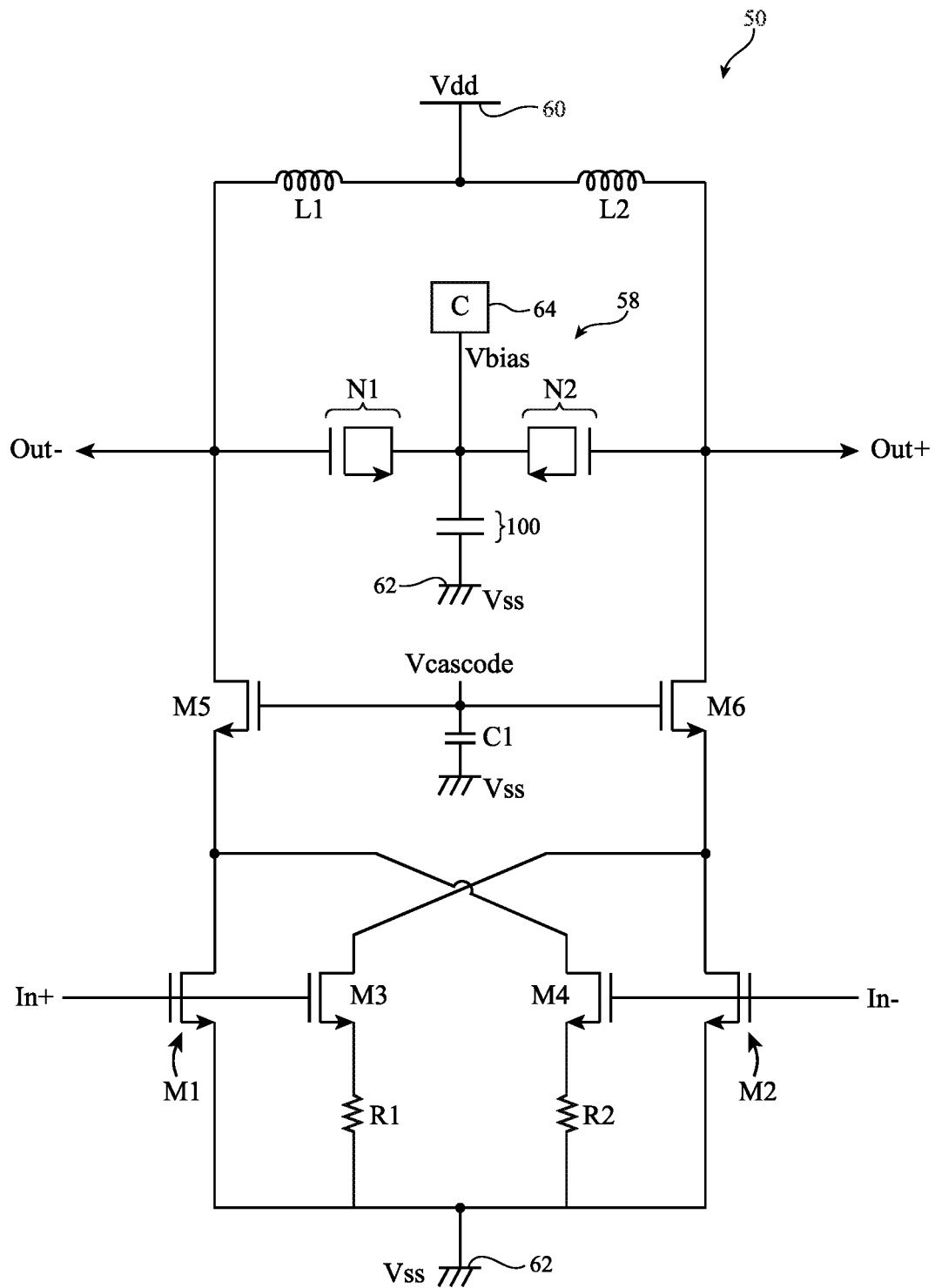
FIG. 10 is a diagram of an illustrative power amplifier having an amplitude modulation to phase modulation (AMPM) compensation circuit coupled at an output port in accordance with some embodiments.

The example of FIG. 3 in which bias voltage Vbias is applied to the gate terminals of n-type MOSCAPs N1 and N2 is merely illustrative. FIG. 10 shows another embodiment of power amplifier 50 having AMPM distortion compensation circuit 58 with bias voltage Vbias applied to the body terminals of the n-type MOSCAPs. As shown in FIG. 10, compensation circuit 58 may include n-type metal-oxide-semiconductor capacitors (MOSCAPs) such as n-type (n-channel) metal-oxide-semiconductor capacitors N1 and N2 and capacitor 100. Metal-oxide-semiconductor capacitor N1 may have a first (body) terminal coupled to the ground power supply line via shunt capacitor 100 and a second (gate) terminal directly coupled to the negative output terminal Out−. Similarly, metal-oxide-semiconductor capacitor N2 may have a first (body) terminal coupled to the ground power supply line via shunt capacitor 100 and a second (gate) terminal directly coupled to the positive output terminal Out+.

The body terminals of metal-oxide-semiconductor capacitors N1 and N2 may be configured to receive bias voltage Vbias from control circuit 64. The Vbias control circuit 64 may be a controller within front-end module 40 (see FIG. 2), a controller within transceiver circuitry 28, a controller within baseband processor 26, or a controller within control circuitry 14 (see FIG. 1). The amount and polarity of AMPM compensation provided by circuit 58 may be controlled by adjusting bias voltage Vbias, which sets the operating point for the metal-oxide-semiconductor capacitors N1 and N2. For instance, bias voltage Vbias can be adjusted to a first voltage level to compensate for any AMPM peaking or can be adjusted to a second voltage level to compensate for any AMPM droop.

The examples of FIGS. 3, 9, and 10 showing an AMPM compensation circuit 58 implemented using one or more MOSCAPs configured to receive an adjustable bias voltage at this gate is merely illustrative. In another embodiment, compensation circuit 58 might be implemented using a varactor. In another embodiment, compensation circuit 58 might be implemented using a bank of switchable capacitors. In general, compensation circuit 58 can be implemented using any capacitive load component.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A radio-frequency power amplifier comprising:
   an input transistor having a gate terminal configured to receive a radio-frequency input signal, a source terminal coupled to a ground power supply line, and a drain terminal coupled to a power amplifier output terminal;
   an inductor having a first terminal coupled to the power amplifier output terminal and a second terminal coupled to a positive power supply line;
   an n-type metal-oxide-semiconductor capacitor having a first terminal coupled to the ground power supply line and having a second terminal coupled to the power amplifier output terminal and configured to receive a bias voltage having a voltage level in a region overlapping with a turn on point of the n-type metal-oxide-semiconductor capacitor; and
   an additional n-type metal-oxide-semiconductor capacitor having a first terminal coupled to the ground power supply line and having a second terminal coupled to an additional power amplifier output terminal and configured to receive the bias voltage.

2. The radio-frequency power amplifier of claim 1, further comprising:
   an additional input transistor having a gate terminal configured to receive the radio-frequency input signal, a source terminal coupled to the ground power supply line, and a drain terminal coupled to the additional power amplifier output terminal; and
   an additional inductor having a first terminal coupled to the additional power amplifier output terminal and a second terminal coupled to the positive power supply line.

3. The radio-frequency power amplifier of claim 2, further comprising:
   a first cascode transistor having a first source-drain terminal coupled to the drain terminal of the input transistor, a second source-drain terminal coupled to the power amplifier output terminal, and a gate terminal configured to receive a cascode bias voltage; and
   a second cascode transistor having a first source-drain terminal coupled to the drain terminal of the additional input transistor, a second source-drain terminal coupled to the additional power amplifier output terminal, and a gate terminal configured to receive the cascode bias voltage.

4. The radio-frequency power amplifier of claim 2, further comprising:
   a first capacitance neutralization transistor having a source terminal coupled to the ground power supply line, a drain terminal coupled to the drain terminal of the additional input transistor, and a gate terminal coupled to the gate terminal of the input transistor; and
   a second capacitance neutralization transistor having a source terminal coupled to the ground power supply line, a drain terminal coupled to the drain terminal of the input transistor, and a gate terminal coupled to the gate terminal of the additional input transistor.

5. The radio-frequency power amplifier of claim 4, further comprising:
   a first resistor coupled between the source terminal of the first capacitance neutralization transistor and the ground power supply line; and
   a second resistor coupled between the source terminal of the second capacitance neutralization transistor and the ground power supply line.

6. The radio-frequency power amplifier of claim 2, wherein:
   the first terminal of the n-type metal-oxide-semiconductor capacitor comprises a body terminal coupled to the ground power supply line; and
   the first terminal of the additional n-type metal-oxide-semiconductor capacitor comprises a body terminal coupled to the ground power supply line.

7. The radio-frequency power amplifier of claim 6, wherein the second terminal of the n-type metal-oxide-semiconductor comprises a gate terminal and wherein the second terminal of the additional n-type metal-oxide-semiconductor comprises a gate terminal, further comprising:
   a first capacitor coupled between the gate terminal of the n-type metal-oxide-semiconductor capacitor and the power amplifier output terminal; and
   a second capacitor coupled between the gate terminal of the additional n-type metal-oxide-semiconductor capacitor and the additional power amplifier output terminal.

8. The radio-frequency power amplifier of claim 7, further comprising:
a first resistor having a first terminal coupled to the gate terminal of the n-type metal-oxide-semiconductor capacitor and having a second terminal configured to receive the bias voltage; and
a second resistor having a first terminal coupled to the gate terminal of the additional n-type metal-oxide-semiconductor capacitor and having a second terminal configured to receive the bias voltage.

9. The radio-frequency power amplifier of claim 6, wherein the second terminal of the n-type metal-oxide-semiconductor comprises a gate terminal and wherein the second terminal of the additional n-type metal-oxide-semiconductor comprises a gate terminal, further comprising:
a first resistor having a first terminal coupled to the gate terminal of the n-type metal-oxide-semiconductor capacitor and having a second terminal configured to receive the bias voltage; and
a second resistor having a first terminal coupled to the gate terminal of the additional n-type metal-oxide-semiconductor capacitor and having a second terminal configured to receive the bias voltage.

10. The radio-frequency power amplifier of claim 1, wherein the first terminal of the n-type metal-oxide-semiconductor capacitor comprises a body terminal coupled to the ground power supply line.

11. The radio-frequency power amplifier of claim 10, wherein the second terminal of the n-type metal-oxide-semiconductor comprises a gate terminal, further comprising:
a resistor having a first terminal coupled to the gate terminal of the n-type metal-oxide-semiconductor capacitor and having a second terminal configured to receive the bias voltage.

12. The radio-frequency power amplifier of claim 11, further comprising:
an additional capacitor having a first terminal coupled to the gate terminal of the n-type metal-oxide-semiconductor capacitor and having a second terminal coupled to the power amplifier output terminal.

13. The radio-frequency power amplifier of claim 1, wherein:
the bias voltage is increased to decrease an average capacitance associated with the n-type metal-oxide-semiconductor capacitor; and
the bias voltage is decreased to increase the average capacitance associated with the n-type metal-oxide-semiconductor capacitor.

14. A radio-frequency power amplifier comprising:
an input transistor having a gate terminal configured to receive a radio-frequency input signal via a power amplifier input terminal, a source terminal coupled to a ground power supply line, and a drain terminal coupled to a power amplifier output terminal;
an inductor having a first terminal coupled to a power amplifier output terminal and a second terminal coupled to a positive power supply line; and
an n-type metal-oxide-semiconductor (MOS) capacitor having a gate terminal coupled to the power amplifier input terminal and configured to receive a bias voltage that is adjusted to a voltage level in a region overlapping with a turn on point for the n-type MOS capacitor to mitigate signal peaking associated with the input transistor.

15. The radio-frequency power amplifier of claim 14, further comprising:

an additional input transistor having a gate terminal configured to receive the radio-frequency input signal via an additional power amplifier input terminal, a source terminal coupled to the ground power supply line, and a drain terminal coupled to an additional power amplifier output terminal;
an additional inductor having a first terminal coupled to the additional power amplifier output terminal and a second terminal coupled to the positive power supply line; and
an additional n-type metal-oxide-semiconductor capacitor having a gate terminal coupled to the additional power amplifier input terminal.

16. The radio-frequency power amplifier of claim 15, wherein:
the n-type metal-oxide-semiconductor capacitor has a body terminal coupled to the ground power supply line; and
the additional n-type metal-oxide-semiconductor capacitor has a body terminal coupled to the ground power supply line.

17. The radio-frequency power amplifier of claim 16, further comprising:
a first capacitor coupled between the gate terminal of the n-type metal-oxide-semiconductor capacitor and the power amplifier input terminal;
a first resistor having a first terminal coupled to the gate terminal of the n-type metal-oxide-semiconductor capacitor and having a second terminal configured to receive a bias voltage;
a second capacitor coupled between the gate terminal of the additional n-type metal-oxide-semiconductor capacitor and the additional power amplifier input terminal; and
a second resistor having a first terminal coupled to the gate terminal of the additional n-type metal-oxide-semiconductor capacitor and having a second terminal configured to receive the bias voltage.

18. An electronic device comprising:
one or more processors configured to generate digital signals;
a transceiver configured to generate radio-frequency signals based on the digital signals; and
power amplifier circuitry configured to amplify the radio-frequency signals for wireless transmission by an antenna, the power amplifier circuitry having
a first input transistor having a first source-drain terminal coupled to a ground line, a second source-drain terminal coupled to a first output terminal, and a gate terminal configured to receive the radio-frequency signals from the transceiver,
a second input transistor having a first source-drain terminal coupled to the ground line, a second source-drain terminal coupled to a second output terminal, and a gate terminal configured to receive the radio-frequency signals from the transceiver,
a first inductor coupled between the first output terminal and a positive power supply line,
a second inductor coupled between the second output terminal and the positive power supply line, and
an amplitude modulation to phase modulation (AMPM) compensation circuit coupled to the first and second output terminals, wherein the AMPM compensation circuit is not directly coupled to the gate terminals of the first and second input transistors, wherein the AMPM compensation circuit comprises at least one n-type metal-oxide-semiconductor capacitor with a gate terminal configured to receive a bias voltage and coupled to the first output terminal, and wherein the bias voltage has a voltage level in a region overlapping with a turn on point of the at least one n-type metal-oxide-semiconductor capacitor.

19. The electronic device of claim 18, wherein the AMPM compensation circuit comprises:
an additional n-type metal-oxide-semiconductor capacitor having a gate terminal coupled to the second output terminal and configured to receive the bias voltage and having a body terminal that is coupled to the ground line.

20. The electronic device of claim 19, wherein the AMPM compensation circuit further comprises:
a first capacitor coupled between the first output terminal and the gate terminal of the at least one n-type metal-oxide-semiconductor capacitor;
a first resistor having a first terminal coupled to the gate terminal of the at least one n-type metal-oxide-semiconductor capacitor and having a second terminal configured to receive the bias voltage;
a second capacitor coupled between the second output terminal and the gate terminal of the additional n-type metal-oxide-semiconductor capacitor; and
a second resistor having a first terminal coupled to the gate terminal of the additional n-type metal-oxide-semiconductor capacitor and having a second terminal configured to receive the bias voltage.

* * * * *